(12) United States Patent
Brown et al.

(10) Patent No.: US 9,076,658 B1
(45) Date of Patent: Jul. 7, 2015

(54) HIGH PRECISION METAL THIN FILM LIFTOFF TECHNIQUE

(71) Applicant: The United States of America, as represented by the Administrator of the National Aeronautics and Space Administration, Washington, DC (US)

(72) Inventors: Ari D. Brown, Ellicott City, MD (US); Amil A. Patel, Palo Alto, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 14/496,674

(22) Filed: Sep. 25, 2014

(51) Int. Cl.
*H01L 21/00* (2006.01)
*H01L 21/033* (2006.01)
*H01L 21/283* (2006.01)

(52) U.S. Cl.
CPC ........ *H01L 21/0332* (2013.01); *H01L 21/0337* (2013.01); *H01L 21/0331* (2013.01); *H01L 21/283* (2013.01)

(58) Field of Classification Search
CPC ............ H01L 21/0331; H01L 21/0332; H01L 21/0337; H01L 21/283
See application file for complete search history.

(56) References Cited

U.S. PATENT DOCUMENTS

2009/0111061 A1*  4/2009  Chau et al. .................... 430/323
2010/0159154 A1*  6/2010  Baer et al. ..................... 427/526

* cited by examiner

*Primary Examiner* — Richard Booth (57) ABSTRACT

A metal film liftoff process includes applying a polymer layer onto a silicon substrate, applying a germanium layer over the polymer layer to create a bilayer lift off mask, applying a patterned photoresist layer over the germanium layer, removing an exposed portion of the germanium layer, removing the photoresist layer and a portion of the polymer layer to expose a portion of the substrate and create an overhanging structure of the germanium layer, depositing a metal film over the exposed portion of the substrate and the germanium layer, and removing the polymer and germanium layers along with the overlaying metal film.

20 Claims, 7 Drawing Sheets

HIGH PRECISION METAL THIN FILM LIFTOFF TECHNIQUE

ORIGIN OF THE INVENTION

Invention by Government Employee(s) Only

The invention described herein was made by one or more employees of the United States Government, and may be manufactured and used by or for the Government for governmental purposes without the payment of any royalties thereon or therefor.

BACKGROUND

The disclosed embodiments generally relate to micro-fabrication processes and more particularly to thin film liftoff techniques.

Liftoff is a method for patterning deposited films. A pattern is generally defined on a substrate using photoresist and standard photolithography. A film, usually metallic, is blanket-deposited all over the substrate, covering the photoresist and areas in which the photoresist has been cleared. During the actual lifting-off, the photoresist under the film is removed with solvent, taking the film with it, and leaving behind only the film which was deposited directly on the substrate.

Figure 1A:
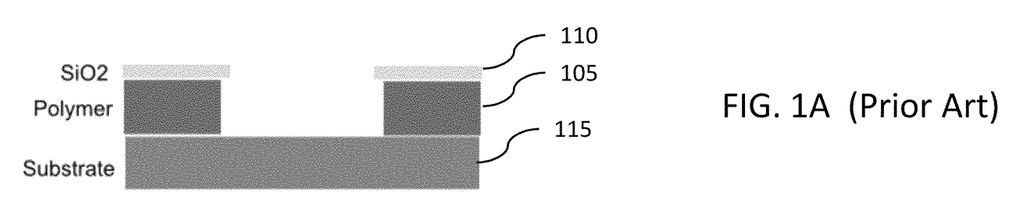
FIGS. 1A-1C show an example of a conventional liftoff process.
Figure 1B:
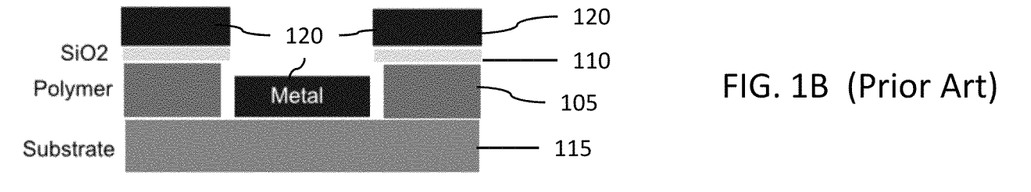
Figure 1C:
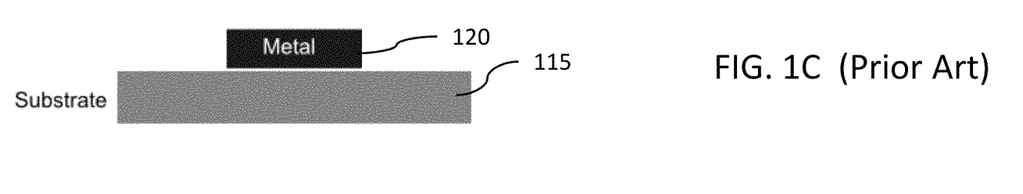

FIGS. 1A-1C show an example of a conventional liftoff process. FIG. 1A shows a bilayer liftoff mask comprising a polymer layer 105 and a silicon dioxide layer 110, typically prepared by lithography and dry etching, applied to a substrate 115. FIG. 1B shows a thin film metal 120 applied by electron-beam evaporation. Thickness of the polymer layer 105 is generally greater than the thickness of the thin film metal layer 120, and precise and reproducible control of a liftoff mask thickness and undercut are difficult. Use of a sputter source is prohibited because sputtering may cause the sidewalls of the silicon dioxide and polymer layers to be coated creating spurious features. As shown in FIG. 1C, a solvent soak is used to lift off the mask, leaving the thin film 120 with substantially vertical sidewalls. Furthermore, sputter deposition techniques may conformally coat various surfaces of the mask, which may result in unwanted topographies at the edge of the film denoted herein as "flags."

Some liftoff masks are made of material that might outgas when subjected to high vacuum. This may introduce impurities in the deposited metal film leading to degraded performance, for example, higher microwave losses or lower transition temperatures.

In some instances, dry, reactive ion or inert ion etching processes may cause damage to the underlying substrate, which can degrade the performance of a micro-fabricated transmission line for sub-mm radiation, because (1) if the dielectric thickness abutting the metal line is different across the length of the line, then there are unwanted reflections due to impedance changes across the length of the line, and (2) if the surface roughness of the dielectric increases; consequently, the dielectric loss due to excitations of two-level systems increases. As a result, the fabrication of low loss superconducting transmission lines is difficult, especially low loss interconnecting circuitry for the 0.3-3 THz spectral range.

Figure 2A:
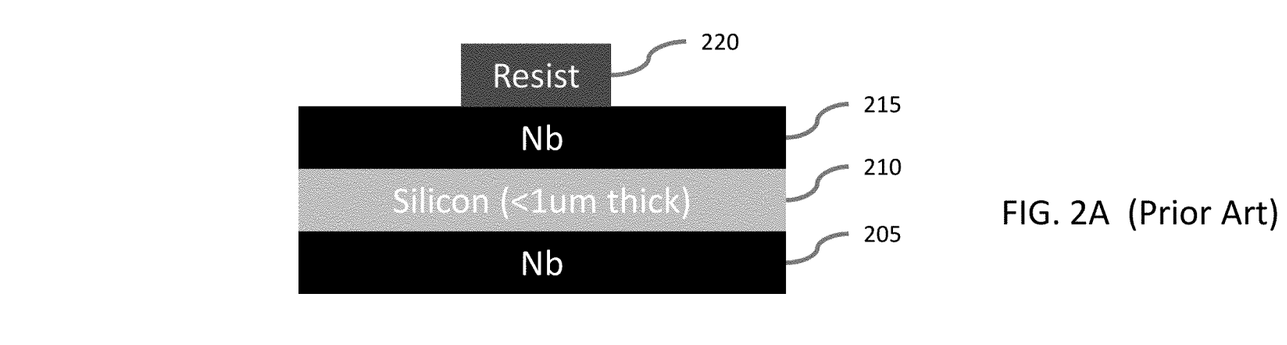
FIGS. 2A and 2B illustrate results of using a dry etch process to fabricate a superconducting structure.
Figure 2B:
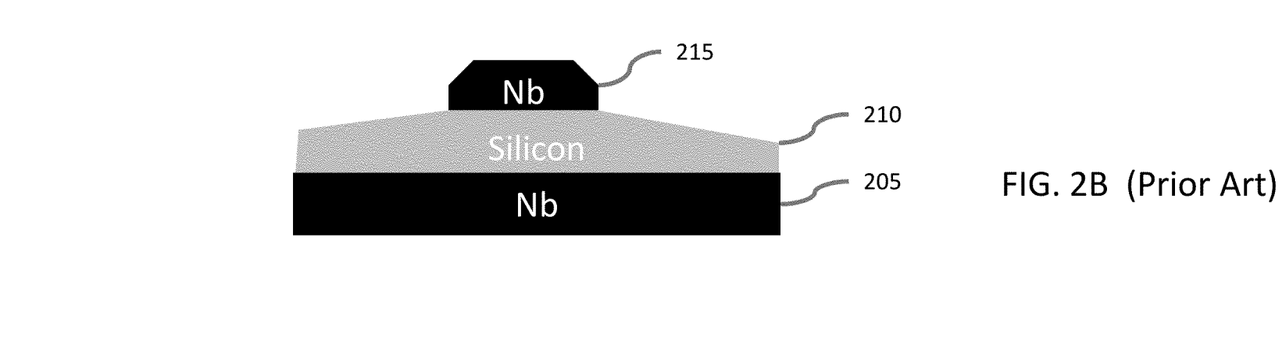

FIGS. 2A and 2B illustrate some of the disadvantages of a dry etch process when used to fabricate superconducting structures. As shown in FIG. 2A, a structure includes a first layer of niobium 205, a layer of silicon 210, and a second layer of niobium 215. A layer of resist 220 is deposited over a portion of the second layer of niobium 215. The structure is then subjected to a dry etch process, however, as shown in FIG. 2B, the dry etch erodes the silicon layer producing a roughened layer that does not have a uniform thickness.

Some Si substrates consist of ultra-thin layers on the order of 0.5 microns under which a metallic layer is deposited. This metallic layer may act as a mirror, which results in optical interference during the photolithographic exposure process used to pattern the film. This interference may occasionally result in distortion of the patterned feature. This results in poor control of a liftoff mask pattern, especially with features in a two micron range.

Some techniques may use polymeric liftoff masks, however, polymeric liftoff masks may provide poor feature size control at a two micron scale. Also, substrate temperatures may exceed 120 degrees Celsius during metal deposition, causing some polymers to adhere to underlying layers and leading to poor liftoff.

It would be advantageous to provide micro-fabrication materials and techniques that overcome these and other disadvantages.

SUMMARY

The aspects of the disclosed embodiments are directed to patterning thin metal films on silicon substrates. The thin metal films may be deposited using physical vapor deposition techniques, which include thermal evaporation, electron-beam evaporation, and DC magnetron sputtering. The processes disclosed herein include fabricating a liftoff mask, depositing a metal, and lifting off the metal in acetone. Fabrication of the liftoff mask includes spinning on a polymer layer, depositing a germanium layer, patterning the germanium layer using a polymeric photoresist, etching the germanium layer using a reactive ion etcher (RIE), and etching the polymer layer using an oxygen plasma. When using niobium as the metal, the realized niobium thin films are lifted off with a liftoff mask comprising a thinned photoresist or poly(methyl methacrylate) (PMMA), as the polymer liftoff layer, and a germanium hard mask. Alternate embodiments may utilize different polymer layer thicknesses and materials and different germanium thicknesses to control different features of the metal film, for example, cross sectional geometries and flag dimensions. These disclosed embodiments may be implemented using standard photolithographic equipment, for example, a spin coater, a hotplate, a mask aligner, as well as a reactive ion etcher (RIE) to etch the germanium and ash the polymer layers.

In one aspect of the disclosed embodiments, a metal film liftoff process includes applying a polymer layer onto a silicon substrate, depositing a germanium layer over the polymer layer to create a bilayer lift off mask, applying a photoresist layer onto the germanium layer and patterning the photoresist layer, etching an exposed portion of the germanium layer, removing the photoresist layer and a portion of the polymer layer to expose a portion of the substrate and create an overhanging structure of the germanium layer, depositing a metal film over the exposed portion of the substrate and the germanium layer, and removing the polymer and germanium layers.

In another aspect of the disclosed embodiments, a metal film liftoff process includes fabricating a bilayer liftoff mask from a germanium layer deposited over a polymer layer spun onto a silicon substrate, applying a photoresist layer onto the germanium layer and patterning the photoresist layer, etching an exposed portion of the germanium layer, removing the photoresist layer, creating an overhanging structure of the germanium layer by removing a portion of the polymer layer while exposing a portion of the substrate, depositing a metal film over the exposed portion of the substrate and the germanium layer, and dissolving the polymer layer to liftoff the bilayer liftoff mask.

BRIEF DESCRIPTION OF THE DRAWINGS

The foregoing aspects and other features of the embodiments are explained in the following description, taken in connection with the accompanying drawings, wherein.

DETAILED DESCRIPTION

The disclosed embodiments are directed to providing thin metal film liftoff processes in which a metallic thin film is lifted off of a silicon substrate. The processes use a liftoff mask which is comprised of a metallic germanium layer and a polymer layer. The thickness and undercut of both layers can be well controlled, which permits a wide variety of thin-film geometries to be lifted off accurately while providing good feature definition.

FIGS. 3A-3G illustrate a high precision liftoff technique according to aspects of the disclosed embodiments. Although the disclosed embodiments will be described with reference to the embodiments shown in the drawings and described below, it should be understood that these could be embodied in many alternate forms. In addition, any suitable size, shape or type of elements or materials could be used.

Figure 3A:
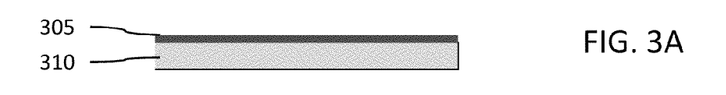
FIGS. 3A-3G illustrate a liftoff process according to aspects of the disclosed embodiments.
Figure 3B:
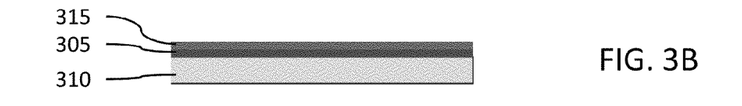
Figure 3C:
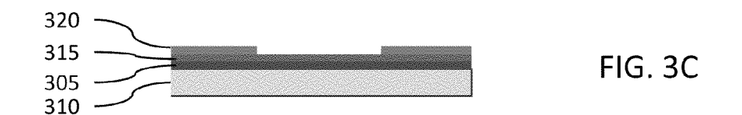
Figure 3D:
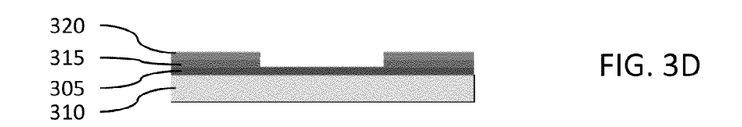
Figure 3E:
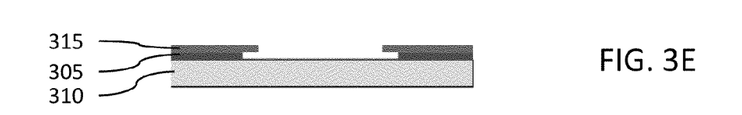
Figure 3F:
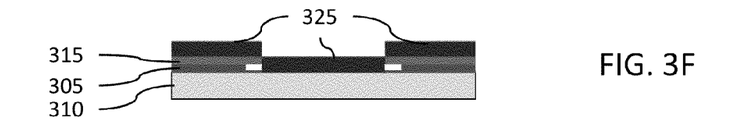
Figure 3G:
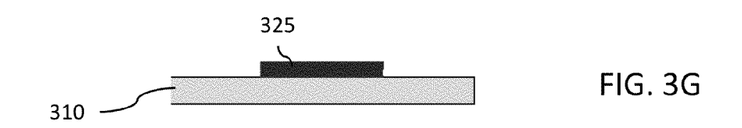

As shown in FIG. 3A, a polymer layer 305 is spun onto a silicon substrate 310. The polymer layer may comprise a photoresist material, a PMMA polymer, or any suitable polymer material. A germanium thin film 315 is deposited over the polymer layer as illustrated in FIG. 3B. In at least one embodiment, the germanium thin film 315 is deposited via electron beam deposition. FIG. 3C shows a photoresist 320 spun onto the germanium layer and patterned using standard photolithographic processing. As shown in FIG. 3D, an exposed portion of the germanium layer 315 is etched. According to one or more embodiments, the germanium layer 315 may be etched using a $SF_6/O_2$ plasma in a reactive ion etcher. The photoresist layer 320 and polymer layer 305 are ashed to create an overhanging structure in the liftoff mask as shown in FIG. 3E. In some embodiments, the polymer layer may be ashed using an $O_2$ plasma in a reactive ion etcher. FIG. 3F shows deposition of a thin metal film 325 over the remaining portion of the germanium layer 315 and an exposed portion of the substrate 310. FIG. 3G shows the result of dissolving the polymer portion of the liftoff mask, leaving a portion of the metal film 325 on the substrate 310. In at least one embodiment, the polymer portion of the liftoff mask may be dissolved using acetone.

Figure 4:
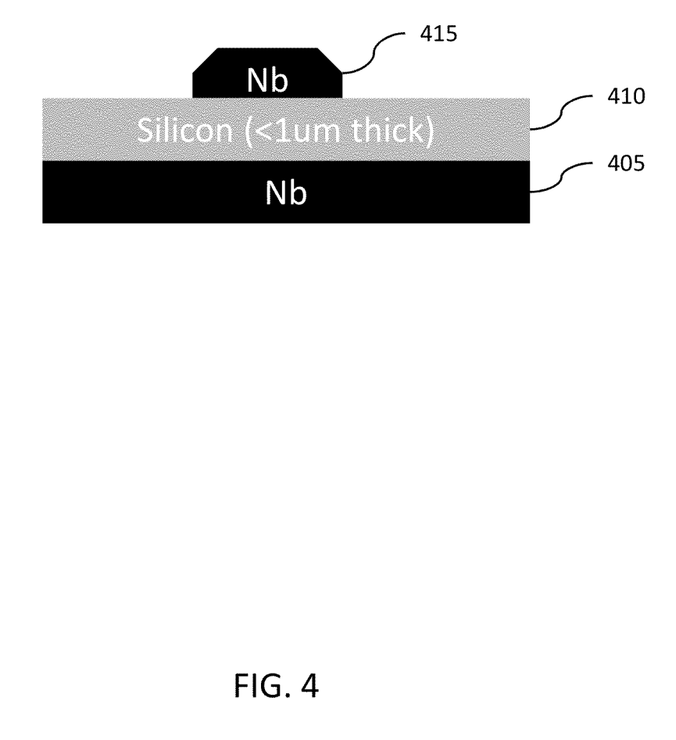
FIG. 4 shows an exemplary superconducting structure fabricated using the high precision liftoff technique according to aspects of the disclosed embodiments.

FIG. 4 shows an exemplary superconducting structure with three layers 405, 410, 415 fabricated using the high precision liftoff technique of FIGS. 3A-3G. Germanium and polymer layers are used in place of photoresist and the germanium and polymer layers are removed by dissolving the polymer, using the technique described above with respect to FIGS. 3A-3G instead of a dry etch as described with respect to FIGS. 2A and 2B. As a result, the silicon layer thickness remains uniform and the surface of the silicon layer 410 remains atomically smooth.

Figure 5A:
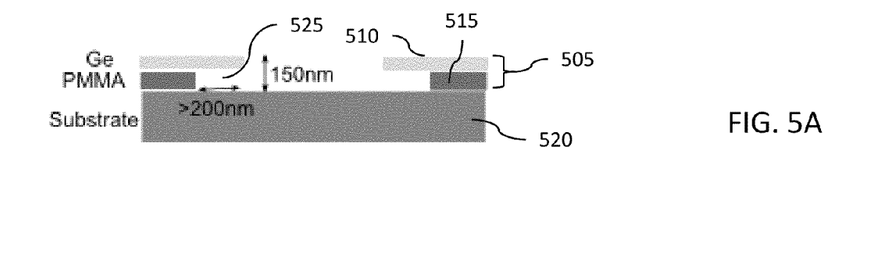
FIGS. 5A-5D illustrate another exemplary liftoff process according to the embodiments disclosed herein.
Figure 5B:
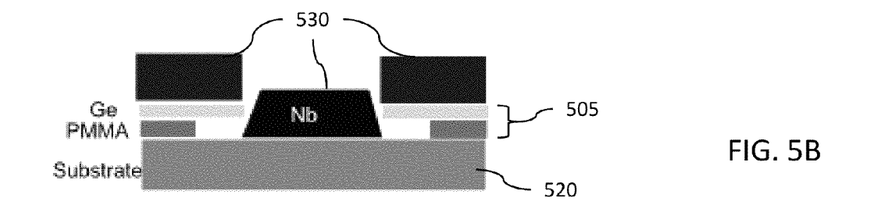
Figures 5C, 5D:
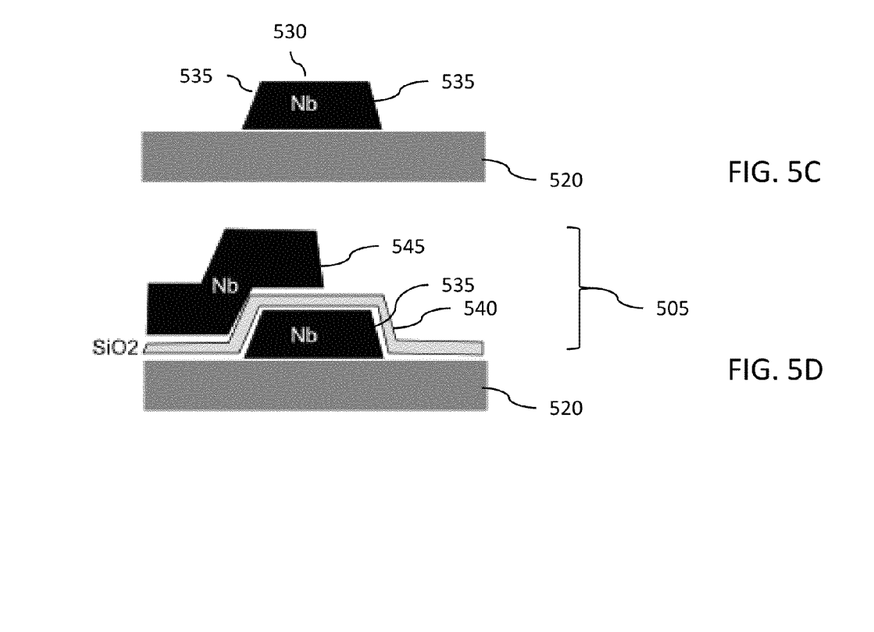

FIGS. 5A-5D illustrate additional advantages of the liftoff process according to the disclosed embodiments. FIG. 5A shows a bilayer liftoff mask 505 prepared by lithography and dry etching applied to a substrate 520. In this embodiment, the bilayer liftoff mask 505 includes a germanium hard mask 510 applied over a polymer 515, for example, a PMMA polymer. The bilayer liftoff mask 505 may have a height of approximately 150 nm or any height suitable for practicing the disclosed embodiments. The polymer layer 515 is undercut as disclosed above. Advantageously, one or more embodiments may allow for an undercut 525 that extends for greater than 200 nm, however, other embodiments may utilize any suitable undercut dimensions. FIG. 5B shows the results of sputtering a metal thin film 530 over the substrate 520 and mask 505. The germanium polymer combination liftoff mask 505 allows the metal film to be sputtered without coating the sidewalls of the layers and allows for shaping the metal film, for example, shaping the resulting sidewalls 535. The thickness of the metal film 530 may exceed the thickness of the liftoff mask 505 without bridging between the metal film deposited on the exposed substrate and the metal film deposited on the germanium hard mask. As shown in FIG. 5C, after solvent liftoff the metal film remains with the shaped sidewalls 535. It should be noted that the geometry of the sidewalls 535 may be engineered or shaped by controlling the thickness of both layers of the liftoff mask. It should also be noted that the germanium layer 510 may be lifted using a wet etchant if required. Referring to FIG. 5D, the techniques allow for deposition of continuous films 540, for example, a $S_iO_2$, layer 540, over the metal film 535 and allows for creation of one or more embedded devices, for example, at least one capacitor, by adding one or more additional metal film layers 545. The liftoff technique also provides for shaping the metal layer without disturbing the surface of the silicon substrate 520.

Additional advantages of the disclosed embodiments include precise control of the liftoff mask pattern. In some embodiments, a germanium hard mask may be used because of the ease in translating the desired pattern to the liftoff mask. This allows the realization of lift off metal thin film patterns and cross sectional geometries with increased fidelity and line width control, for example, better than 0.2 micron fidelity. A germanium hard mask (as opposed to polymeric or $S_iO_2$ hard mask) also has the advantage of minimizing reflections from the underlying substrate (which may be a complex stack of dielectrics and patterned materials). Reducing the stray reflections helps ensure pattern fidelity during the photolithography process.

The disclosed embodiments also provide for precise and reproducible control of the liftoff mask thickness, where control is achieved by setting a spin speed and dilution of the polymeric material and by setting a germanium film thickness during electron-beam evaporation. The undercut may be controlled by setting amounts of oxygen gas flow, power, and time in the reactive ion etcher.

Figure 6A:
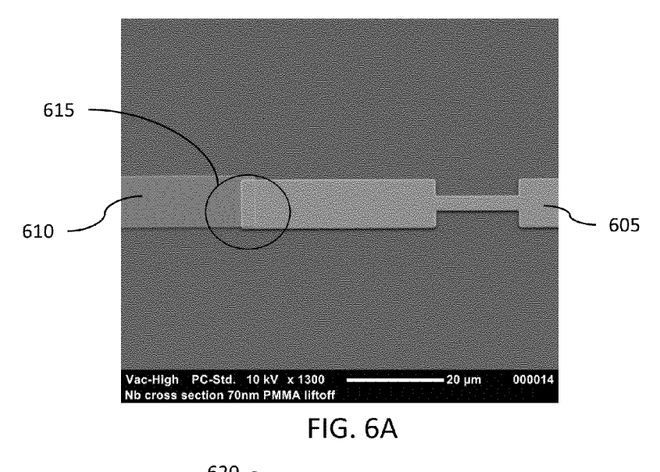
FIGS. 6A, 6B, 7A and 7B show exemplary microstructures fabricated according to the disclosed embodiments.
Figure 6B:
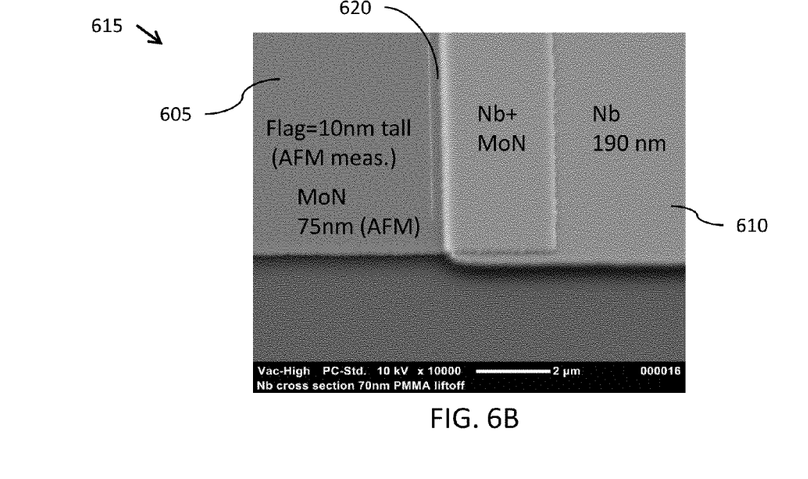

The precise and reproducible control of the liftoff mask thickness allows for:

engineering the sidewall geometry of the lifted off metal thin film and facilitating coverage of an overlaying thin film. For example, FIG. 6A shows an exemplary structure comprising a niobium feedline 605 overlaid with a molybdenum nitride line 610 as part of a blocking filter. FIG. 6B shows an expanded view of the area 615 of FIG. 6A, where the molybdenum nitride line 610 having, for example, a thickness of approximately 75 nm overlays the niobium feedline 605 having, for example, a thickness of approximately 190 nm. The disclosed embodiments allow the junction 620 of the molybdenum nitride line 610 and the niobium feedline 605 to be fabricated with continuous coverage and having a typical flag or foot of approximately 10 nm extending perpendicular away from the page. In contrast, standard polymeric liftoff techniques generally produce flags hundreds or even thousands of nm tall.

Figure 7A:
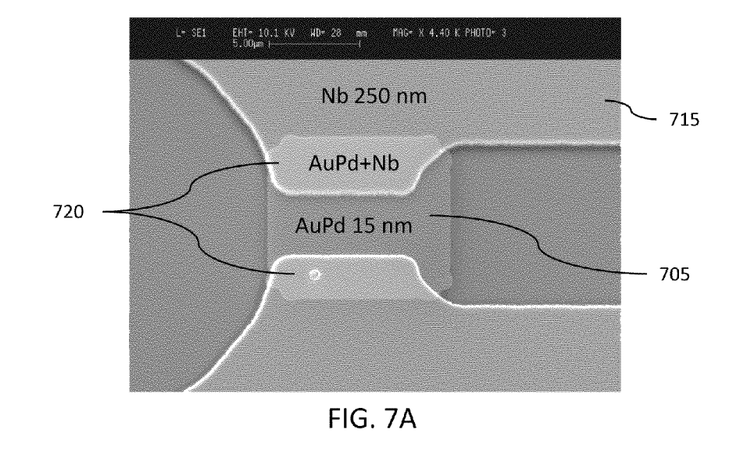
Figure 7B:
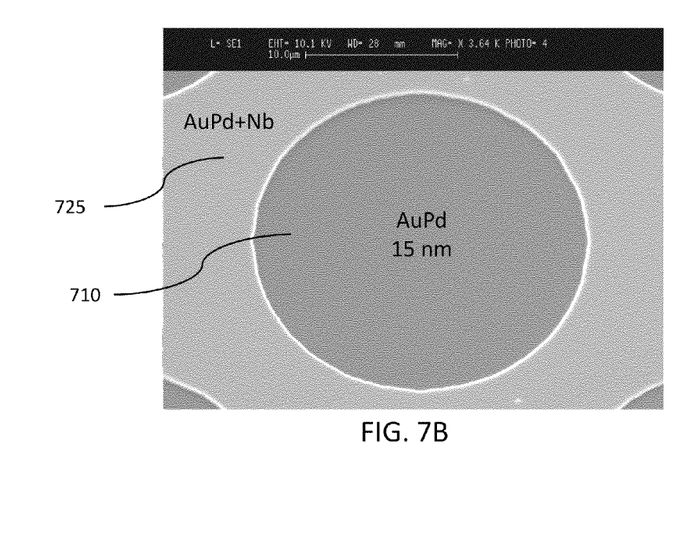

- facilitating the liftoff process, which is dependent on the ability of the solvent to reach the exposed polymer. For example, by increasing the amount of polymer undercut, the liftoff may have a higher likelihood of being successful, because a larger volume of solvent can displace the area between the deposited thin film and the polymer.
- facilitating the liftoff process, which is dependent on the ability of the entire liftoff mask to be dissolved. For example, the polymer can be dissolved in an organic solvent and the germanium can be dissolved in dilute hydrochloric or phosphoric acid, which do not chemically attack materials like silicon or niobium. If the entire liftoff mask can be dissolved, then the probability of the liftoff being successful is close to unity.
- metal-thin-film liftoff of films with film thickness much larger than the liftoff mask. This provides for thick film liftoff, which is very challenging for conventional liftoff processes. For example, the disclosed techniques allow for routine liftoff of metal film thicknesses of approximately 500 nm using a liftoff mask having a thickness of approximately 180 nm.
- metal-thin-film liftoff of sputter deposited thin films, for example, niobium, which are deposited with high power plasmas. This is superior to purely polymeric bilayer liftoff masks which can cross-link on the substrate during deposition, which stymies dissolution of the polymeric liftoff mask and results in a metal film with an undesired pattern.
- a liftoff technique, in which projecting "flags" can be vanishingly small. For example, niobium thin films may be produced having flags smaller than 10 nm tall. In contrast, standard polymeric liftoff techniques generally produce flags hundreds or even thousands of nm tall. Large flags have undesired consequences including: fissures occurring in overlying thin films resulting in undesired manifestations when the films are used as part of an electrical circuit. The manifestations include electrical shorts, electrical opens, and superconducting junctions. For example, as shown in FIGS. 7A and 7B, the disclosed liftoff technique advantageously may be capable of providing 15 nm AuPd films 705, 710 onto lifted off 250 nm Nb films 715 to produce AuPd Nb overlays 720, 725 without any evidence of fissures. It should be understood that the AuPd and Nb thicknesses are exemplary and that the disclosed embodiments include other suitable thickness combinations. Undesired consequences may also include restriction of superconducting current flow in superconducting transmission lines. In a superconducting transmission line, current may generally bunch up at an edge of a line. If there is a thin flag at the line edge, current flowing in the flag will cause the superconducting material to behave as a conventional material where power will dissipate in the line, which will translate into unwanted transmission line loss. Because of the power dissipation, the flag will essentially be a "dead zone" in which no appreciable current will flow. The dead zone will restrict the super current into a smaller cross sectional area in the transmission line, which may increase undesired phase delays.
- a liftoff mask which does not appreciably outgas in a high vacuum deposition chamber. This results in a cleaner deposited thin film, the implications of which include the realization of films with very low microwave loss. For example, the disclosed techniques have been used to fabricate 1.4 cm long Nb/Si/Nb microstrip transmission lines using the presently disclosed liftoff techniques. The resulting transmission lines exhibit less than 20% of loss in the 0.4-0.5 THz spectral band. This amount of loss is comparable to or lower than currently available structures which typically exhibit approximately 20-50% loss/cm at 0.5 THz.
- a metal thin film patterning technique which does not damage an underlying substrate. This is in contrast with dry, reactive ion or inert ion, etching processes. For example, the present techniques have been used to fabricate a working far-infrared spectrometer on a 450 nm-thick silicon substrate with lifted off Nb transmission lines and ground planes. Dry etching techniques for etching a niobium structure would damage the silicon substrate, preventing proper operation of the spectrometer. Preventing damage to the underlying substrate is critical for building low loss transmission lines because (1) if the dielectric thickness abutting the metal line is different across the length of the line, then there are unwanted reflections due to impedance changes of the line, and, (2) if the surface roughness of the dielectric increases, the dielectric loss due to excitations of two-level systems increases.

The presently disclosed techniques also allow the realization of a wide range of low loss superconducting circuitry, in particular, superconducting sensors and low loss interconnecting circuitry for the 0.3-3 THz spectral range.

It is noted that the embodiments described herein can be used individually or in any combination thereof. It should be understood that the foregoing description is only illustrative of the embodiments. Various alternatives and modifications can be devised by those skilled in the art without departing from the embodiments. Accordingly, the present embodiments are intended to embrace all such alternatives, modifications and variances that fall within the scope of the appended claims.

The invention claimed is:

1. A metal film liftoff process comprising:
applying a polymer layer onto a silicon substrate;
applying a germanium layer over the polymer layer to create a bilayer lift off mask;
applying a patterned photoresist layer over the germanium layer;
removing an exposed portion of the germanium layer;
removing the photoresist layer and a portion of the polymer layer to expose a portion of the substrate and create an overhanging structure of the germanium layer;
depositing a metal film over the exposed portion of the substrate and the germanium layer; and
removing the polymer and germanium layers.

2. The metal film liftoff process of claim 1, wherein the polymer layer comprises a poly methyl methacrylate polymer.

3. The metal film liftoff process of claim 1, wherein the polymer layer comprises a thinned photoresistive material.

4. The metal film liftoff process of claim 1, comprising applying the germanium layer using electron beam deposition.

5. The metal film liftoff process of claim 1, comprising removing the exposed portion of the germanium layer by etching.

6. The metal film liftoff process of claim 1, comprising removing the photoresist layer and the portion of the polymer layer by ashing.

7. The metal film liftoff process of claim 1, comprising depositing the metal film using a sputtering technique.

8. The metal film liftoff process of claim 1, comprising depositing the metal film at a thickness exceeding a thickness of the bilayer liftoff mask.

9. The metal film liftoff process of claim 1, comprising depositing the metal film without bridging between the metal film deposited on the exposed substrate and the metal film deposited on the germanium layer.

10. The metal film liftoff process of claim 1, comprising depositing a metal film of a superconducting material over the exposed portion of the substrate and the germanium layer.

11. The metal film liftoff process of claim 10, wherein the superconducting material comprises niobium.

12. The metal film liftoff process of claim 1 comprising removing the polymer and germanium layers by dissolving the polymer layer.

13. The metal film liftoff process of claim 12 comprising removing the polymer and germanium layers by dissolving the polymer layer using acetone.

14. A metal film liftoff process comprising:
fabricating a bilayer liftoff mask from a germanium layer deposited over a polymer layer spun onto a silicon substrate;
applying a photoresist layer onto the germanium layer and patterning the photoresist layer;
etching an exposed portion of the germanium layer;
removing the photoresist layer;
creating an overhanging structure of the germanium layer by removing a portion of the polymer layer while exposing a portion of the substrate;
depositing a metal film over the exposed portion of the substrate and the germanium layer; and
dissolving the polymer layer to liftoff the bilayer liftoff mask.

15. The metal film liftoff process of claim 14, wherein the polymer layer comprises a poly methyl methacrylate polymer.

16. The metal film liftoff process of claim 14, wherein the polymer layer comprises a thinned photoresistive material.

17. The metal film liftoff process of claim 14, comprising removing the photoresist layer and the portion of the polymer layer by ashing.

18. The metal film liftoff process of claim 14 comprising depositing the metal film using a sputtering technique.

19. The metal film liftoff process of claim 14, comprising depositing the metal film at a thickness exceeding a thickness of the bilayer liftoff mask.

20. The metal film liftoff process of claim 1, comprising depositing the metal film without bridging between the metal film deposited on the exposed substrate and the metal film deposited on the germanium layer.

* * * * *